(12) United States Patent
Stemmer

(10) Patent No.: US 7,840,049 B2
(45) Date of Patent: Nov. 23, 2010

(54) MR IMAGE RECONSTRUCTION METHOD AND MR APPARATUS USING PROPELLER IMAGING

(75) Inventor: Alto Stemmer, Abenberg (DE)

(73) Assignee: Siemens Aktiengesellschaft, Munich (DE)

( * ) Notice: Subject to any disclaimer, the term of this patent is extended or adjusted under 35 U.S.C. 154(b) by 980 days.

(21) Appl. No.: 11/406,575

(22) Filed: Apr. 18, 2006

(65) Prior Publication Data

US 2006/0264735 A1 Nov. 23, 2006

(30) Foreign Application Priority Data

Apr. 18, 2005 (EP) .................................. 05008415

(51) Int. Cl.
*G06K 9/00* (2006.01)
*G06K 9/32* (2006.01)
*G01V 3/00* (2006.01)

(52) U.S. Cl. ...................... 382/131; 382/128; 382/132; 382/294; 382/296; 324/309

(58) Field of Classification Search ................ 382/128, 382/131, 132, 294, 296; 324/309
See application file for complete search history.

(56) References Cited

U.S. PATENT DOCUMENTS

| 5,833,609 | A | 11/1998 | Dannels et al. | |
|---|---|---|---|---|
| 5,850,486 | A | 12/1998 | Maas, III et al. | |
| 6,151,378 | A | * | 11/2000 | Rasche et al. ................ 378/4 |
| 6,486,670 | B2 | 11/2002 | Heid | |
| 6,828,788 | B2 | * | 12/2004 | Wang .......................... 324/309 |

(Continued)

FOREIGN PATENT DOCUMENTS

| CA | 2147556 A1 | 10/1996 |
|---|---|---|
| WO | WO 2004093682 A1 * | 11/2004 |

OTHER PUBLICATIONS

Eddy, William F., Mark Fitzgerald, and Douglas C. Noll. "Improved Image Registration by Using Fourier Interpolation." Magnetic resonance in medicine 36/6(1996): 923-931. Print.*

(Continued)

*Primary Examiner*—Matthew C Bella
*Assistant Examiner*—Michael A Newman
(74) *Attorney, Agent, or Firm*—Schiff Hardin LLP

(57) ABSTRACT

In a magnetic resonance (MR) image reconstruction method and MR apparatus, for raw MR data are acquired with the propeller technique, and k-space sampling ensues in sub-data sets. The sample points of each sub-data set correspond to grid points of a Cartesian initial grid and the Cartesian initial grid of the sub-data sets can be brought into congruence by rotation: A Cartesian final grid is selected, and a calculation-based transfer of the data points of each sub-data set ensues to a respective new grid that exhibits the orientation of the respective sub-data set and the grid constants of the final grid, if the grid constants of the output grid differ from those of the final grid. A calculation-based transfer of the data points of each sub-data set, or the data points of a respective new grid (if obtained) ensures to the final grid by the application of a rotation module followed by transformation of the acquired data into the image domain.

10 Claims, 6 Drawing Sheets

U.S. PATENT DOCUMENTS

| | | | |
|---|---|---|---|
| 6,882,148 B2* | 4/2005 | Pipe | 324/307 |
| 7,023,207 B1* | 4/2006 | Gaddipati et al. | 324/309 |
| 7,372,269 B2 | 5/2008 | Takizawa et al. | |
| 2004/0114791 A1 | 6/2004 | Atkinson | |
| 2004/0136608 A1* | 7/2004 | Rosenfeld | 382/276 |
| 2006/0232273 A1* | 10/2006 | Takizawa et al. | 324/309 |

OTHER PUBLICATIONS

Eddy et al. "Improved Image Registration by Using Fourier Interpolation." Magnetic resonance in medicine 36/6(1996): 923-931.*

"Sampling Density Compensation in MRI: Rationale and an Iterative Numerical Solution," Pipe et al., Magnetic Resonance in Medicine, vol. 41 (1999) pp. 179-186.

"Motion Correction With Propeller MRI: Application to Head Motion and Free-Breathing Cardiac Imaging," Pipe, Magnetic Resonance In Medicine, vol. 42 (1999) pp. 963-969.

"Reconstruction by Weighted Correlation for MRI With Time-Varying Gradients," Maeda et al, Trans. On Medical Imaging, vol. 7, No. 1 (Mar. 1988) pp. 26-31.

"Selection of a Convolution Function for Fourier Inversion Using Gridding," Jackson et al, IEEE Trans. on Medical Imaging, vol. 10, No. 1 (Sep. 1991) pp. 473-478.

"MRI Diffusion Tensor Reconstruction with Propeller Data Acquisition," Cheryauka et al, Magnetic Resonance Imaging, vol. 22 (2004) pp. 139-148.

"Improved Image Registration by Using Fourier Interpolation," Eddy et al, Resonance In Medicine, vol. 36, (1996) pp. 923-931.

"Rotation of NMR Images Using the 2D Chirp-z Transform," Tong et al, Magnetic Resonance in Medicine, vol. 41 (1999) pp. 253-256.

"A Rapid Look-Up Table Method for Reconstructing MR Images from Arbitrary K-Space Trajectories," Dale et al, IEEE Trans. on Medical Imaging, vol. 20, No. 3 (Mar. 2001) pp. 207-217.

* cited by examiner

FIG 4
Before movement compensation
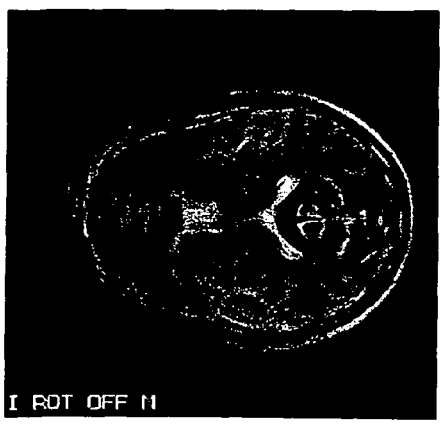 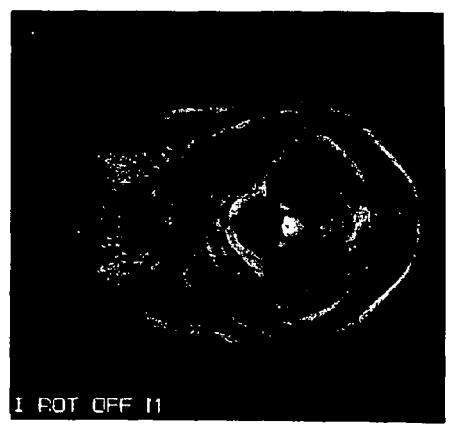
After movement compensation
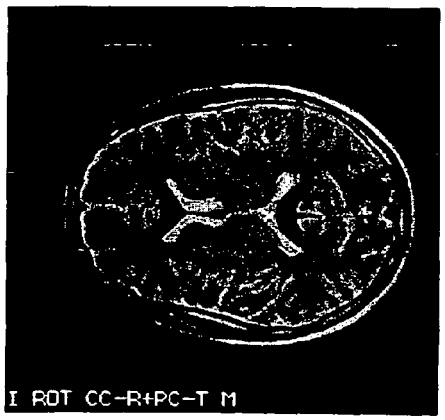 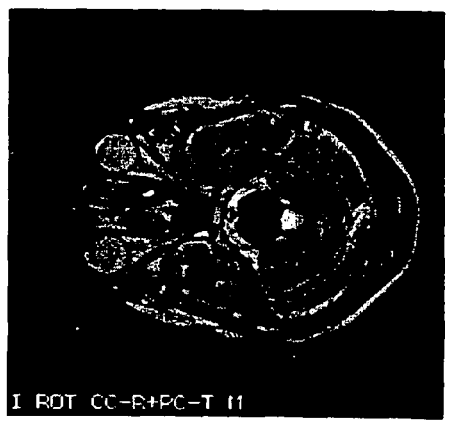

FIG 5
Gridding
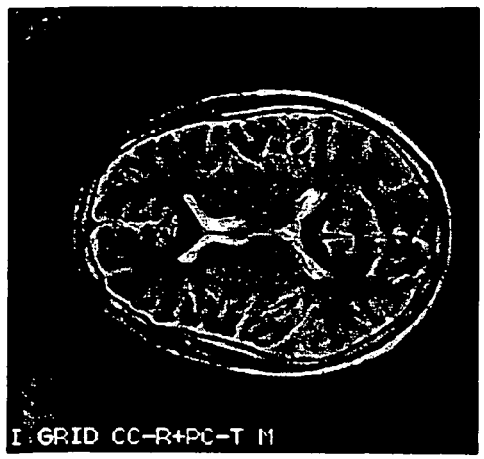
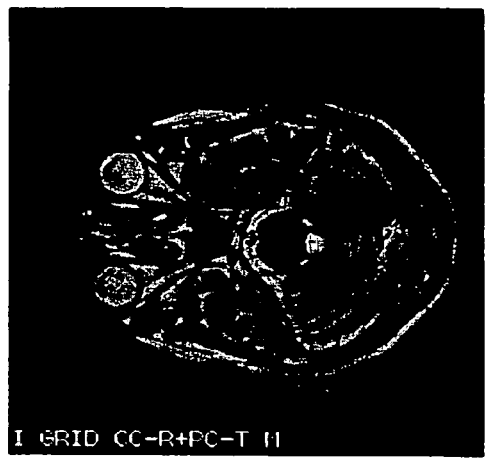
Inventive method
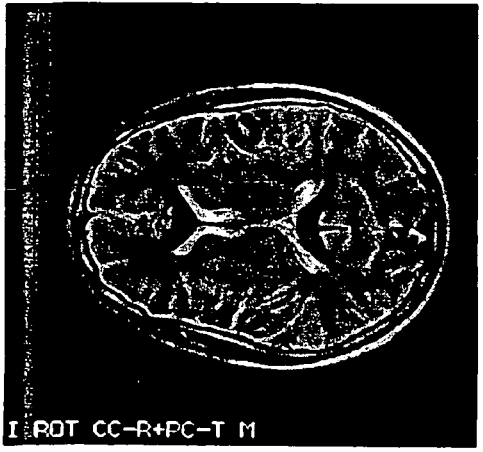
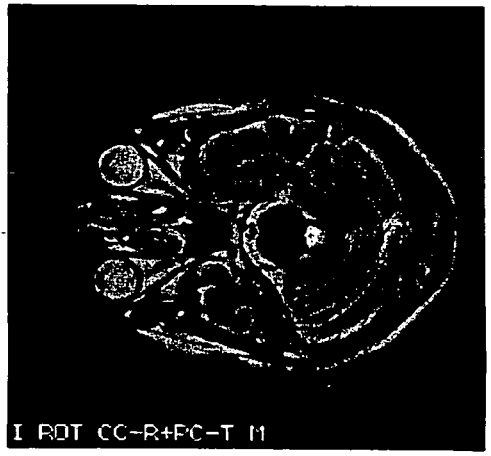

FIG 6
Upper series
(before rotation module)
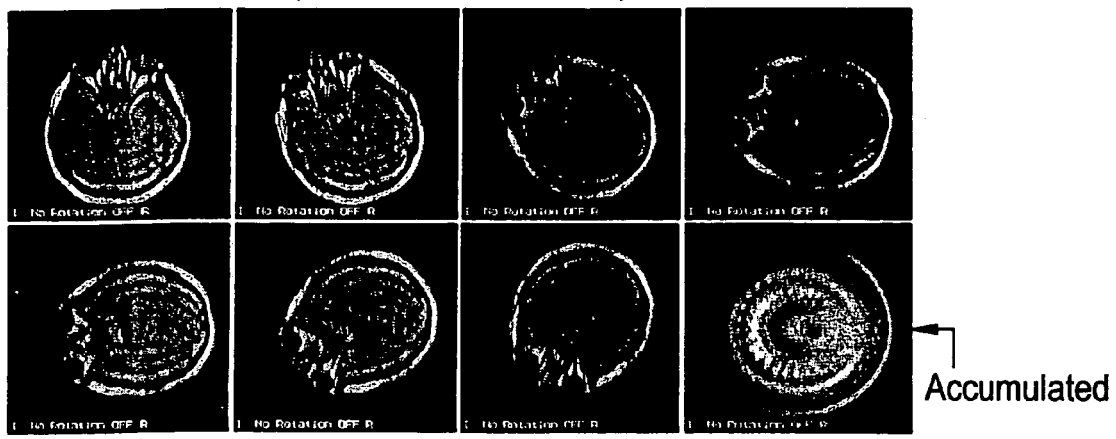
Accumulated
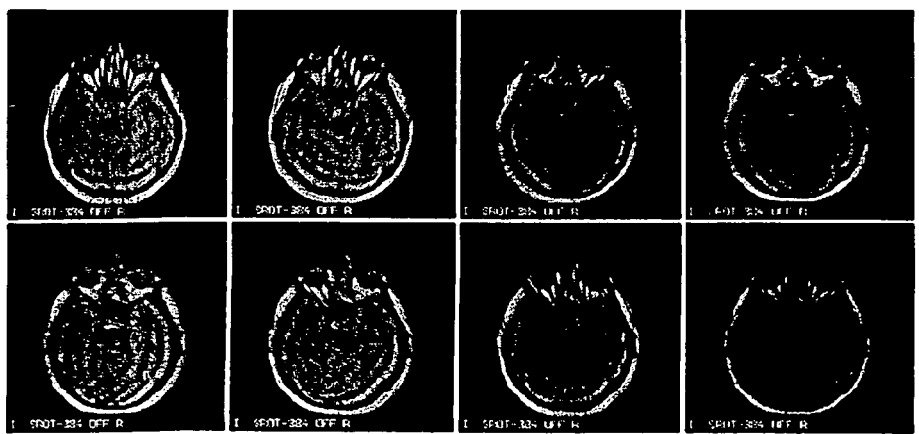
Lower series
(after rotation module)　　Accumulated

MR IMAGE RECONSTRUCTION METHOD AND MR APPARATUS USING PROPELLER IMAGING

BACKGROUND OF THE INVENTION

1. Field of the Invention

The present invention generally concerns magnetic resonance tomography (MRT) as employed in medicine for examination of patients. The present invention in particular concerns an improved image reconstruction method with regard to the image generation from raw data that have been acquired with a known technique called the propeller technique.

2. Description of the Prior Art

The propeller technique represents a radial scanning method in MRT imaging and is briefly described in the following. A detailed representation is found in "Magnetic Resonance in Medicine 42: 963-969" (1999) by James G Pipe. In the propeller technique, the scanning of k-space ensues on the basis of a series of blades. Each of the blades is composed of L equidistant, parallel phase encoding lines. A blade is composed of the L lines of a conventional k-space trajectory with Cartesian sampling for which the phase coding gradient has the smallest amplitude. The k-space sampling according to the propeller technique proceeds by the individual blades of the series being rotated relative to one another around the center of k-space. The rotation angle o⁻¹1 and the number N of the total number of blades thereby represent characteristic parameters that are selected such that the series covers or overlaps the entire k-space of interest (see FIG. 2). In comparison with other acquisition techniques in MRT, the propeller technique has the advantage that a circular region (with diameter L) in the center of the k-space is, as it were, covered by each individual blade. The comparison of two different blades with regard to this center data allows movements of the patient to be determined that occur between the acquisition of two blades. This movement information then can be taken into account in the propeller image reconstruction using all measured raw data, so that it is possible to acquire nearly movement-free images (see FIG. 4).

Given a conventional Cartesian scanning in MRT, the measured values (frequency raw data) represent Cartesian grid points. The grid points arranged in a Cartesian manner in the frequency domain enable images to be reconstructed in a simple manner, namely using a simple fast Fourier transformation (FFT). This is not possible in the propeller technique. The propeller technique belongs to the group of non-Cartesian imaging methods (scanning methods) that require a much more complex raw data processing in order to be able to ultimately reconstruct real images from the measured raw data. Image reconstruction methods for the propeller technique according to the prior art are described in the following section.

The current best known image reconstruction method that can generally be used given non-Cartesian k-space sampling is based on two different procedures:

a) The first method is the "direct Fourier transformation method". A detailed representation of this method is found in an article of the periodical "IEEE Trans Med Imaging 7: 26-31 (1988) by A. Maeda et al." This method is very precise, but is not used in practice due to the large processing (calculating) requirement. In this method, the two-dimensional image I(x,y) is reconstructed according to the formula:

$$I(x, y) = \sum_{i=0}^{N_s} w(i) \cdot s(k_x(i), k_y(i)) \cdot e^{j2\pi(xk_x(i) + yk_y(i))/N_S}$$

wherein $(k_x(i), k_y(i))$ represent the k-space coordinates of the measurement point i along the trajectory. $s(k_x(i) k_y(i))$ is the measurement result, thus the resonance signal. The weighting function w(i) is necessary in order to generally allow for the non-uniform k-space sampling and the resulting different sampling density in the individually considered k-space points, given non-Cartesian k-space sampling. The summation extends over all $N_s$ measured data packets in the frequency domain.

b) The second method represents is known as the "gridding method". A detailed explanation of this method is found in an article of the periodical "IEEE Trans Med Imaging 10: 473-478 (1991) by Jackson J I et al." In a procedure according to the gridding method, each data point, or the data point compensated/corrected by weighting, is subjected to a folding and projected onto a suitable Cartesian grid. This existing raw data set (now Cartesian) is then transformed into the image domain by means of a fast Fourier transformation (FFT). The desired image can be obtained in that the result of this FFT is divided by the Fourier-transformed kernel core (inverse folding, or deconvolution).

All presently-publicized image reconstruction methods use the gridding method with regard to the propeller technique. Aside from these two techniques a) and b) that are both applicable to k-space samples along arbitrary k-space trajectories, still further image reconstruction methods also exist that are, however, based on specific (special) k-space sampling trajectories. One example is the back-projection in radial MRT imaging. The latter cannot be used in the propeller technique according to the present state of the art.

SUMMARY OF THE INVENTION

The present invention concerns in a method as well as a magnetic resonance tomography apparatus for implementation of the method that allow a simple (and thus quicker) reconstruction of images from raw data that have been acquired with the propeller technique.

In accordance with the invention, a method image reconstruction in magnetic resonance tomographic imaging, the k-space sampling ensues in sub-data sets, and the sample points of each sub-data set correspond to grid points of a Cartesian initial (output) grid and the Cartesian initial grid of the sub-data sets can be brought into congruence via by rotation, selection of a Cartesian final grid, is selected, and a calculation-based transfer of the data points of each sub-data set to a respective new grid is undertaken that exhibits the orientation of the sub-data set and the grid constants of the final grid, when the grid constants of the output grid differ from those of the final grid.

A calculation-based transfer of the data points of each sub-data set or the data points of a new grid obtained as described above, to the final grid, is undertaken by the application of a rotation module. The acquired data are then transformed into the image domain.

The transfer steps preferably ensue on the basis of an interpolation.

The transformation into the image domain can proceed according to the steps of accumulating the result of the aforementioned transfer to the final grid, compensating the acquired data to the local sample density, and subjecting the compensated, acquired data to a fast Fourier transformation.

According to the invention, the above steps can be executed in the above-stated order, in an arbitrary order.

At least two of these steps can be implemented in a single step.

The inventive method can be used particularly advantageously in propeller imaging methods in which the sub-data set represents a blade.

The inventive method turns out to be particularly simple when the rotation module is based on successive shear, but other rotation methods are also possible.

Furthermore, it can be advantageous when a phase correction and/or a scaling (zoom-in or zoom-out) and/or a displacement compensation precede the rotation module, and when the rotation module executes a rotation movement compensation.

In order to prevent image blurring, the inventive determination of the local sample density is required. This is advantageously acquired by determination of a density matrix on the basis of the respective calculation of a unit sub-data set corresponding to each sub-data set and is used for density compensation.

The above object also is achieved in accordance with the invention by a magnetic resonance tomography apparatus is suitable for implementation of the method described above.

DESCRIPTION OF THE DRAWINGS

FIG. 4 shows the movement correction that is possible with the propeller technique, in the example of a head acquisitions.

FIG. 5 shows a comparison of movement-corrected images acquired with the propeller technique and reconstructed with the gridding technique and with the inventive method, FIG. 6 shows the mode of operation of the rotation module using two propeller image series with a recumbent image subject.

DESCRIPTION OF THE PREFERRED EMBODIMENTS

Figure 1:
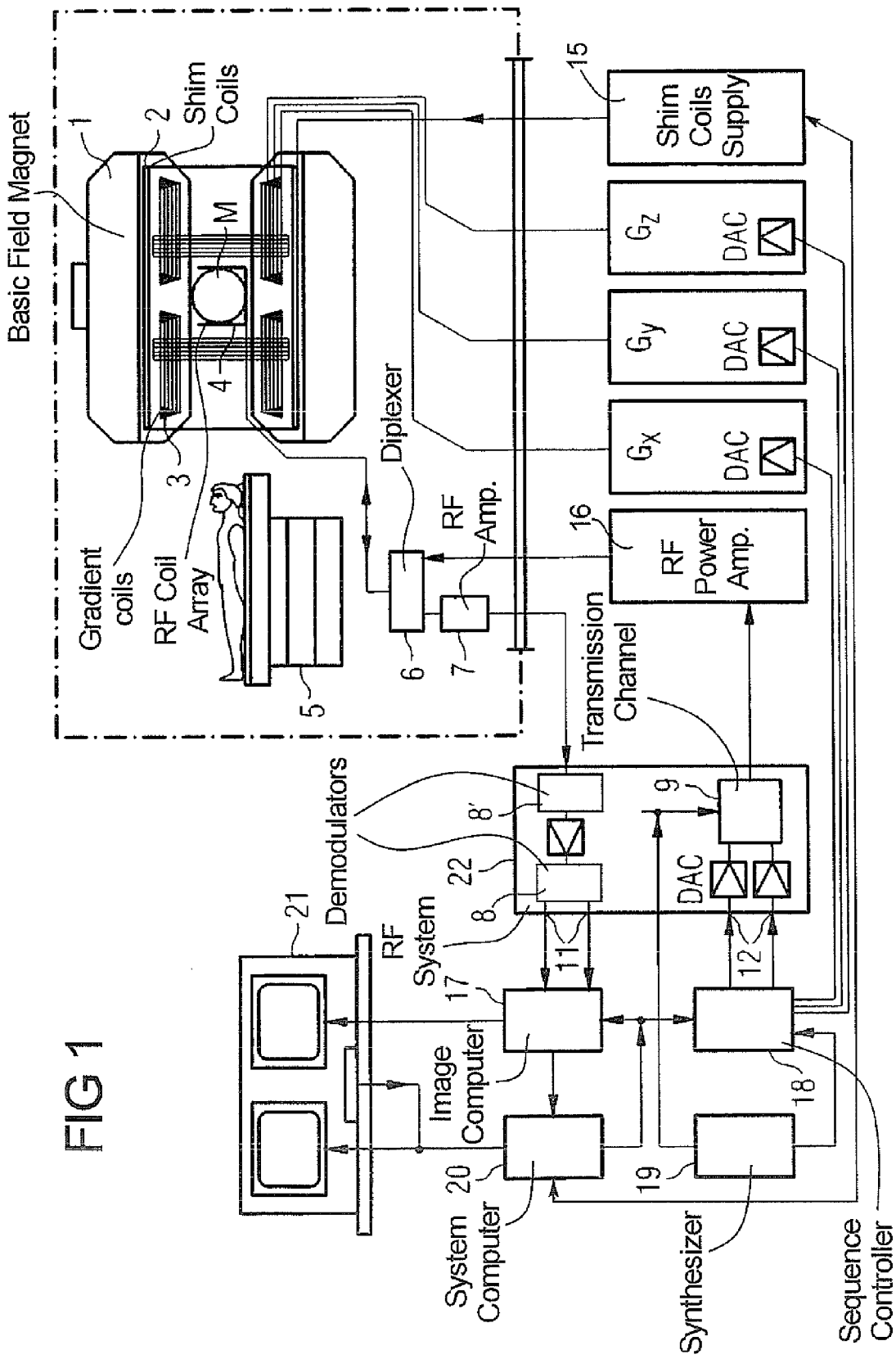
FIG. 1 schematically illustrates a magnetic resonance tomography apparatus according to the present invention.
Figure 2:
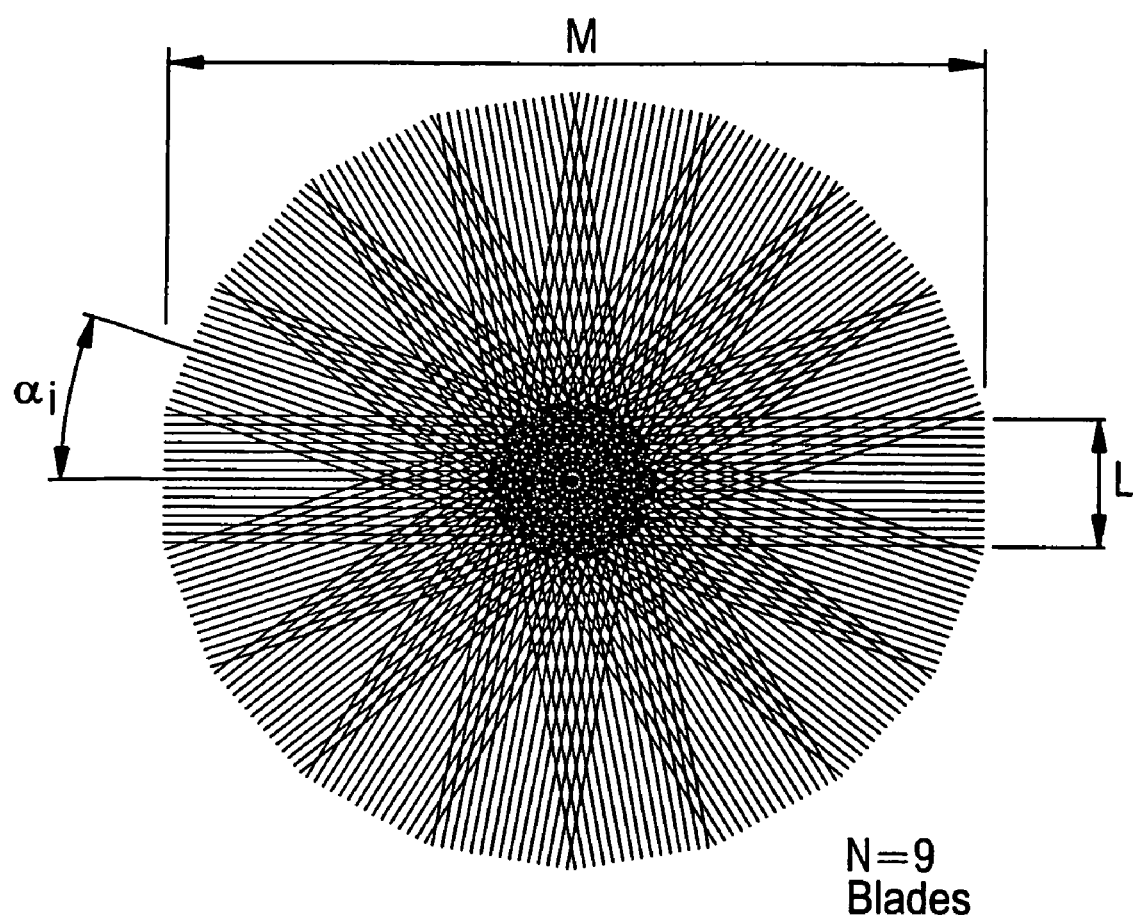
FIG. 2 schematically shows the k-space sampling according to the propeller technique with N=9 blades, wherein each blade has L=15 phase coding lines.

FIG. 1 shows an inventive magnetic resonance imaging (tomography) apparatus for generation of MRT images of a subject with the PROPELLER technique on the basis of an image reconstruction method according to the present invention. A basic field magnet 1 generates a temporally-constant strong magnetic field for polarization or, respectively, alignment of the nuclear spins in the examination region of a subject such as, for example, a part of a human body to be examined. The high homogeneity of the basic magnetic field necessary for the magnetic resonance measurement is defined in a typically spherical measurement volume M into which the parts of the human body to be examined are introduced. Shim plates made from ferromagnetic material are attached at a suitable point to support the homogeneity requirements and in particular to eliminate temporally-invariable influences. Temporally-variable influences are eliminated by shim coils 2 that are activated via a shim power supply 15.

A cylindrical gradient coil system 3 that has three sub-windings is used in the basic field magnet 1. Each sub-winding is supplied by an amplifier with current for generation of a linear gradient field in the respective direction of the Cartesian coordinate system. The first sub-winding of the gradient coil system 3 generates a gradient $G_x$ in the x-direction, the second sub-winding generates a gradient $G_y$ in the y-direction and the third sub-winding generates a gradient $G_z$ in the z-direction. Each amplifier has a digital-analog converter that is activated by a sequence controller 18 for time-accurate generation of gradient coils.

A radio-frequency antenna 4 is located within the gradient coil system 3. The radio-frequency antenna 4 converts the radio-frequency pulses emitted by a radio-frequency power amplifier 16 into an alternating magnetic field for excitation of the nuclei and alignment of the nuclear spins of the subject to be examined or, respectively, of the region of the subject to be examined. The radio-frequency antenna 4 has one or more RF transmission coils and a number of RF reception coils in the form of an annular, preferably linear or matrix-shaped arrangement of component coils. The alternating field emitted by the processing nuclear spins, i.e. normally the nuclear spin echo signals caused by a pulse sequence made up of one or more radio-frequency pulses and one or more gradient pulses, is also converted into a voltage by the RF reception coils of the radio-frequency antenna 4, which voltage is supplied via an amplifier 7 to a radio-frequency reception channel 8 of a radio-frequency system 22. The radio-frequency system 22 furthermore has a transmission channel 9 in which are generated the radio-frequency pulses for the excitation of the magnetic resonance. The respective radio-frequency pulses are digitally represented in the sequence controller 18 as a series of complex numbers based on a pulse sequence provided by the system computer 20. This number series is supplied as a real part and as an imaginary part to a digital-analog converter in the radio-frequency system 22 via inputs 12 and is supplied from this digital-analog converter to a transmission channel 9. In the transmission channel 9, the pulse sequences are modulated on a radio-frequency carrier signal whose base frequency corresponds to the resonance frequency of the nuclear spins in the measurement volume.

The switching from transmission to reception operation ensues via a transmission-reception diplexer 6. The RF transmission coil of the radio-frequency antenna 4 radiates the radio-frequency pulses for excitation of the nuclear spins into the measurement volume MV and samples resulting echo signals via the RF reception coils. The correspondingly-acquired magnetic resonance signals are phase-sensitively demodulated on an intermediate frequency in the reception channel 8' (first demodulator) and digitized in an analog-digital converter (ADC). This signal must be demodulated at the frequency 0. The demodulation at frequency 0 and separation into real proportion and imaginary proportion occurs according to the digitization in the digital domain in a second demodulator 8. An image is reconstructed by an image computer 17 from the measurement data so acquired. The administration of the measurement data, the image data and the control programs ensues via the system computer 20. Based on a specification with control programs, the sequence controller 18 monitors (controls) the generation of the desired pulse sequences and the corresponding sampling of k-space. The sequence controller 18 controls the time-accurate switching of the gradients, the emission of the radio-frequency pulses with defined phase and amplitude as well as the reception of the magnetic resonance signals. The time base for the radio-frequency system 22 and the sequence controller 18 is provided by a synthesizer 19. The selection of corresponding control programs for generation of a magnetic resonance image as well as the representation of the generated magnetic resonance image ensues via a terminal (console) 21 that includes a keyboard as well as one or more display screens.

The present invention represents an improved alternative to the image reconstruction methods a) and b) described above, such image reconstruction methods a) and b) as such in particular serve for the image reconstruction of data sets that have been acquired with the propeller method. The inventive method is essentially implemented by the image computer 17 of the magnetic resonance tomography apparatus described above. The method is based on the realization that the raw data (acquired with the propeller technique) of each individual blade generally come to lie on the grid points of a Cartesian coordinate grid. The respective Cartesian coordinate grids of different blades are arranged rotated around the center of k-space. The basis of the inventive reconstruction method is to transfer the data set (sub-data set) associated with each blade, starting from its Cartesian initial grid, into a selected k-space grid (designated as a "final grid" herein) by rotation, and to accumulate the data points of all sub-data sets on this final grid. The final k-space grid is the same for all blades; only the rotation angles generally differ for different blades. After all blades have been correspondingly rotated and processed and their data have been compensated in the sense of a local sample density, a fast Fourier transformation generates the desired image. The inventive method includes the following steps:

a) Selection of a Cartesian grid (final grid).

b) For each blade, in the event that the grid spacing of the blade and of the final grid differ, an interpolation of the blade data of the grid points on a new Cartesian grid identically-aligned with regard to the k-space orientation ensues. The identically-aligned Cartesian grid, however, exhibits the same grid spacing as the final grid.

c) Also for each blade, the data on the grid points of the final grid are interpolated by rotation of the sample data (if step b) was not implemented) or the result of step b) (if step b) was implemented) by the angle that aligns or matches the Cartesian grid (modified by interpolation) of the blade corresponding to the final grid.

d) Accumulation of the result from step c).

e) Multiplication of the value of each data point with a suitable factor via which the density distribution of the local sample density is compensated.

f) Implementation of a fast Fourier transformation in order to transform the result of step e) in the image domain.

The quality or the performance of the inventive reconstruction method is directly connected with the implementation of step c). The application of simple interpolation methods in order to acquire pixel values on the final grid (for example bilinear interpolation methods) generally leads to a distinct image degradation due to image smearing (blurring), for example due to a blending of adjacent pixels. Imaging methods involving image rotation in image processing have been thoroughly examined and therefore are very well understood. A number of fast and (with regard to their result) high-quality image rotation methods are described in detail in the relevant technical literature and can be modularly used in step c). For example, one possibility would be to separate the rotation into "successive shear transformations". Each shear can, for example, be implemented in the form of a simple one-dimensional method step. "Successive shear methods" are, for example, described in: Eddy W F, Fitzgerald M, Noll D C, "Improved image registration by using Fourier interpolation", Journal of Magnetic Resonance in Medicine, 1996; 36:923-931.

The following is noted in this regard:

1. The order (sequence) of the steps b) through f) can be varied in different ways. Three examples are as follows:

1.1 In the event that the sample density of the entire k-space trajectory is known at the point in time of the data acquisition of the first blade, the density compensation can be directly applied to the sampled data (this is designated as a "pre-compensation"). In this case, the density-compensation can be implemented before the rotation and before the step b).

1.2 Due to the linearity of the Fourier transformation, it is possible to exchange (swap) the steps d) and f). This means that the Fourier transformation of density-compensated and rotated k-space of the respective blade is implemented first, and only then is the result accumulated in the image domain. This generally increases the calculation effort, since in this case the fast Fourier transformation must be performed N times per image.

1.3 A rotation in k-space corresponds to a rotation in the image domain by the same angle, which, for example, means that rotation operation and Fourier transformation can be exchanged. This in turn means that it is likewise possible to first effect a Fourier transformation of the sampled and density-compensated data of each blade and only then to effect the rotation in the image domain. In this case, the accumulation naturally must likewise ensue in the image domain.

2. In many cases it is possible to combine a number of steps into a single implementation step. An example of this is an algorithm suggested by TONG and COX (Tong R, Cox R W, "Rotation of NMR images using the 2D Chirp-z transform", Magnetic Resonance in Medicine, 1999; 41: 253-256) in which the k-space data are rotated in a single step and are subsequently immediately transformed into the image domain. Given application of this algorithm, the complex images of the individual blades are also accumulated in the image domain, which makes the step of the pre-compensation absolutely necessary.

3. In the original disclosure by Pipe with regard to the propeller technique, the three-dimensional application of this technique is also discussed. Since each step of the proposed inventive reconstruction method can be expanded three-dimensionally in a simple manner, the inventive method likewise represents an image reconstruction method of the 3D propeller technique.

4. The radial MRT imaging represents a special case of the propeller-based acquisition technique in which only one acquisition line per blade is acquired (parameter L=1). In principle, the proposed inventive method can therefore also be used for image reconstruction in radial MRT imaging.

The section now following is concerned with particular features and properties of the inventive reconstruction method, with a comparison with the direct Fourier transformation method or with the gridding method being discussed where it appears to be relevant.

Image Reconstruction Speed:

The time duration for the image reconstruction in the methods a) and b) (direct Fourier transformation technique and gridding method) can be significantly reduced by the use of look-up tables. Look-up tables contain weighting factors that are required for the implementation of both methods and that frequently make necessary the time-consuming determination of transcendent functions. These weighting factors generally can be calculated in advance for different defined k-space trajectories. In MRT imaging, a fixed, predetermined k-space trajectory is frequently sampled multiple times (for example given dynamic application in the framework of a measurement series characterized by multiple successively-implemented measurements), and therefore the reconstruction time duration specified in the literature frequently does not include the time that is necessary in order to calculate the look-up tables. This is not reasonable in the propeller imaging technique. The inherent movement acquisition given propellers changes the rotation angle and therewith the k-space trajectory. The following comparison therefore includes the time that is necessary for calculation of the look-up tables in the image reconstruction. This makes the direct Fourier transformation technique unsuitable since in it $\tilde{M}^2 \cdot N \cdot L \cdot M$ transcendent functions must be determined per image. For this reason, the direct Fourier transformation method is also not applied. The comparison between the gridding technique and the inventive method is very difficult due to the large number of degrees of freedom (parameter combinations) that form the bases of both of these methods. In the following table, experimentally-determined reconstruction times per slice are specified:

| Parameter | Gridding | Inventive method |
|---|---|---|
| L = 19, M = $\tilde{M}$ = 256, N = 21 | 1040 ms/slice | 998 ms/slice |
| L = 35, M = $\tilde{M}$ = 256, N = 42 | 4475 ms/slice | 1975 ms/slice |

The results are based on measurements that were implemented on a personal computer (1 GB RAM) equipped with Windows XP, single processor 2 GHz Pentium 4. The processing code was compiled with a Microsoft Visual C++ 6.0 compiler. A Kaiser-Bessel convolution kernel was used in the gridding method. The width of the convolution kernel used (Kaiser-Bessel window) was set to three. The inventive method is based on a "successive shear method". The comparison is very significant inasmuch as a very high-resolution (and therefore calculation time-intensive) variant of the inventive method is (compared) with a very fast variant (no convolution kernel) of the gridding method.

Image Quality:

A number of data sets from volunteer test subjects were acquired with the inventive propeller method. Each individual data set was reconstructed off-line into an image, and in fact both with the gridding technique and with the inventive method (FIG. 5). A number of experienced users were not able to also detect the slightest differences between the images reconstructed with both techniques with the exception of a few distinct artifacts that occurred in the corners of the images reconstructed with the gridding method. The suppression of artifacts of this type in the images reconstructed according to the inventive method, however, is not the most important advantage by which the inventive method differs from the gridding technique (particularly as medical subjects of interest are normally located in the center region of the field of view (FOV: central acquisition region of k-space), and this type of artifact can possibly be eliminated via a partial back-folding (Engl.: partial deconvolution) or by oversampling.

Simple to Implement:

The variant of the inventive method described in the preceding section is markedly simple to implement since only fundamental FFT operations or FFT calculation methods are applied. The FFT method itself does not specifically have to be implemented manually since effective and universal FFT implementations are commercially available in the form of freely-accessible software (for example FFTW packet). The implementation of the direct Fourier transformation method is likewise simple, however its use is not practical due to its high computational effort for the majority of applications.

No deconvolution or, Respectively, No Back-Folding:

The ideal convolution kernel for convolution-based gridding is a sinc function. In order to limit the reconstruction duration, a practical implementation of the gridding technique is based on the usage of relatively short, finite convolution kernels. Such a limitation of the ideal convolution kernel makes it necessary to ultimately divide the acquired image via the Fourier-transformed convolution function (in the unit that performs this function). This is designated as deconvolution. The inventive method requires no deconvolution step. It should be noted that the shear method in the previously-described variant of the inventive method can in principle likewise be directly implemented in the frequency domain. The multiplication of the Fourier-transformed signals of the sampled signals with the shear matrix thereby corresponds to a convolution of the signal with the inverse Fourier-transformed signals of the shear matrix in the frequency domain (sample domain). In this case the convolution is not limited.

In the following, various implementation suggestions of the inventive method are discussed. These suggestions concern a variant that uses the previously-mentioned successive shear method. As already shown in the specification preamble, the significant advantage of the propeller technique is that the circle in the k-space center that is similarly measured with each blade can be used to detect and to correct a patient movement that occurs between the acquisitions of the individual blades. It is assumed that three acquisition parameters are determined for each blade i: the x-y components of a displacement vector ($\delta x_i$, $\delta y_i$) and the rotation angle $\delta \alpha_i$. The following describes how this 3-component acquisition information is used in the inventive reconstruction method. How these acquisition parameters are determined is not a part of the present invention.

Due to the inherent movement correction, the sample density can be determined only when all blades have been acquired. A post-compensation method is applied for this reason, in which method the density compensation and the last fast Fourier transformation are only implemented when all blades have been measured. The reconstruction method begins with blade-specific processing steps (phase correction+zoom-out, displacement compensation, rotation, accumulation) as soon as the first blade has been acquired. This means that the available computer capacity is already occupied during the acquisition method. In particular when the blades are processed faster than they are acquired, the images are already immediately available after the end of the measurement since the density compensation and the FFT are both markedly fast methods. It should be noted that, given an image reconstruction with pre-compensation methods (in which the density compensation is implemented first), the image reconstruction method cannot be begun before until all blades have been acquired. For this reason, the available computing capacities cannot be used during the acquisition, and the time segment between the end of the acquisition process and the availability of the images generally takes longer, even when the calculation effort is smaller overall.

In the following, the individual steps of the inventive method are described in detail:

1. Phase Correction and (Optional) Scaling

Due to inaccuracies in the framework of the sampling, a phase correction can be necessary. The image domain-based procedure described in the article about propellers is used: the frequency domain data of each blade are transformed into the image domain by means of two-dimensional FFT. The complex image so obtained is demodulated via a phase reference signal. Demodulated means that each pixel of the complex image is multiplied in the image domain with the conjugated complex of the corresponding pixel of the phase reference. This phase-corrected image is then transformed back into the frequency domain by means of two-dimensional inverse fast Fourier transformation (IFFT). The phase reference signal is thereby acquired as follows: the frequency domain data of the blade are initially copied. This copy is low-pass-filtered (for example via windowing with a pyramidal function). The windowed values are then transformed into the image domain. The phase of the acquired low-resolution image forms the phase reference (the phase correction signal). The ratio (relationship) between transformation length of FFT and IFFT is of particular interest. If the transformation length of the forward transformation along one direction (either frequency coding direction or phase coding direction) is selected different from the transformation length of the reverse transformation in this direction, the transformation can be viewed as a scaling of the blade in the selected direction. In the event that the transformation length of the FFT is longer than the transformation length of the IFFT, the blade is scaled back (zoomed-in) in the selected direction. When the transformation length of the FFT in the selected direction is shorter than the transformation length of the IFFT, the blade is scaled forward (zoomed-out) in this selected direction. A zoom-out makes it necessary that the blade data in the image domain after the FFT and after the demodulation, still be filled with zeroes before the IFFT. Such a zoom-out is then advisable when the size of the subject to be imaged is approximately as large as the FOV (FOV=1/Δk field of view), whereby Δk represents the grid constant of the original grid on which the data of the sampled blade come to lie. Otherwise, an interim shear during the rotation step ensuing later would degrade the image quality in the image corners. In the frequency domain, a zoom-out corresponds to a resampling of the data on a refined grid (a grid with smaller grid constants) and simultaneously corresponds to an increase of the number of grid points, such that the maximal frequency is maintained. In the realized variant of the inventive method, the zoom-out factor is approximately $\sqrt{2}$ in the phase coding direction. In the frequency coding direction, the blade is oversampled with a factor of 2 (i.e. it is sampled more finely than would be necessary according to the Nyquist criterion) and is scaled back (zoomed-in), such that the grid spacing in the frequency coding direction and in the phase coding direction is equal after the phase correction.

2. Displacement Compensation

Displacements in the image domain correspond to linear phase displacements in the frequency domain. A displacement compensation can ensue before or after the rotation step (rotation module). When the displacement compensation is implemented before the rotation (the rotation module), the calculation effort is proportional to the product of M and L (~M·L). When it is implemented after the rotation, the calculation effort is proportional to the square of M (~$M^2$). In the propeller technique, L is typically a great deal smaller than M (L<<M), which is why the displacement compensation is applied first. The displacement compensation ensues in that the frequency domain data of the blade are multiplied with a phase factor $e^{j2\pi(k_x \delta x_i + k_y \delta y_i)}$ in order to compensate the phase displacement $e^{j2\pi(k_x \delta \tilde{x}_i + k_y \delta \tilde{y}_i)}$ induced by the translatory displacement $(\delta \tilde{x}_i, \delta \tilde{y}_i)$. $(\delta \tilde{x}_i, \delta \tilde{y}_i)$ represent the components of the displacement vector $(\delta x_i, \delta y_i)$ that are obtained via projection on both axes of the Cartesian grid of the blade.

3. Rotation Module

The rotation angle $\tilde{\alpha}_i = -\alpha_i + \delta \alpha_i$ of a chosen blade very generally has a negative acquisition angle $\alpha_i$ of the blade and a rotation angle $\delta \alpha_i$. A rotation angle $\delta \alpha_i$ occurs only when the patient or, respectively, the subject to be examined (for example the head) performs a rotation movement during the data acquisition. Both (acquisition angle and rotation angle—the latter due to patient movement) can be compensated by the rotation module. An acquisition series without rotation module comprises noisier images rotated counter to one another as they are shown in the upper part of FIG. 6. An accumulation of such image data sets (a summation of the upper image series of FIG. 6) would deliver a completely unusable image (right lower image of the upper image series). Only by the consideration of the acquisition angle and, if applicable, the rotation angle via the rotation module are all image data sets identically aligned (lower image series of FIG. 6), such that they can be accumulated congruently on the final grid (right lower image of the lower image series).

The rotation step is implemented via three consecutive, successive [sic] shear steps. The entire method is based on the following factoring of the rotation matrix:

$$\begin{pmatrix} \cos \tilde{\alpha}_i & -\sin \tilde{\alpha}_i \\ \sin \tilde{\alpha}_i & \cos \tilde{\alpha}_i \end{pmatrix} = \begin{pmatrix} 1 & -\tan\frac{\tilde{\alpha}_i}{2} \\ 0 & 1 \end{pmatrix} \cdot \begin{pmatrix} 1 & 0 \\ \sin \tilde{\alpha}_i & 1 \end{pmatrix} \cdot \begin{pmatrix} 1 & -\tan\frac{\tilde{\alpha}_i}{2} \\ 0 & 1 \end{pmatrix}.$$

The product of the fourth matrix, for example with a vector, displaces the first component of the vector by an offset that is proportional to the second component of the vector. The second component of the vector is retained. Similar to a translation, this shear can be effectively implemented in the frequency domain. For this purpose, each series of the (optionally) scaled, phase-corrected and displacement-compensated blade $\tilde{s}_i$ is first Fourier-transformed forwards:

$$\tilde{t}_i(l, q) = \sum_{m=\tilde{M}/2}^{\tilde{M}/2-1} \tilde{s}_i(l, m) e^{j2\pi qm/\tilde{M}} \text{ with } l = -(\tilde{L}/2), \ldots ,$$

$$-(\tilde{L}/2) + \tilde{L} - 1 \text{ and } q = -\tilde{M}/2, \ldots, \tilde{M}/2 - 1$$

Each element is then multiplied with the respective element of the shear matrix:

$$\hat{t}_i(l, q) = \tilde{t}_i(l, q) \cdot e^{-j2\pi \tan\frac{\tilde{\alpha}_i}{2} ql/\tilde{M}} \text{ with } l = -(\tilde{L}/2), \ldots ,$$

$$-(\tilde{L}/2) + \tilde{L} - 1 \text{ and } q = -\tilde{M}/2, \ldots, \tilde{M}/2 - 1$$

and ultimately inversely Fourier-transformed:

$$\hat{s}_i(l, m) = \frac{1}{\tilde{M}} \sum_{q=\tilde{M}/2}^{\tilde{M}/2-1} \hat{t}_i(l, q) e^{j2\pi qm/\tilde{M}} \text{ with } l = -(\tilde{L}/2),$$

$$\ldots, -(\tilde{L}/2) + \tilde{L} - 1 \text{ and } m = -\tilde{M}/2, \ldots, \tilde{M}/2 - 1$$

wherein $\tilde{M}$ represents the length of the blade in the frequency coding direction and $\tilde{L}$ represents the length of the blade in the phase coding direction, and in fact after the scaling (zooming). In the step width for l and m, the values in the brackets are rounded to the next whole-number value, meaning that $$(\tilde{L}/2) = \frac{\tilde{L}}{2} \text{ when } \tilde{L} \text{ is even}$$

and $$(\tilde{L}/2) = \frac{\tilde{L}-1}{2} \text{ when } \tilde{L} \text{ is odd.}$$

$\tilde{M}$ is thereby assumed to be even.

In order to avoid a degradation of the end result due to a strong intermediate shear, the rotation angle $\tilde{\alpha}_i$ is limited to the transformation to the interval $$[-\frac{\pi}{2}, \frac{\pi}{2}[.$$

In the event that the rotation angle $\tilde{\alpha}_i$ of the blade is greater than or equal to $$\frac{\pi}{2},$$

the points of the blade are initially point-mirrored at the origin and $\tilde{\alpha}_i$ is set to $\tilde{\alpha}_i - \pi$. A point-mirroring thereby corresponds to a rotation by $\pi$ or $-\pi$ and can be implemented without interpolation by exchange of the pixel values. In the event that $\tilde{\alpha}_i$ is smaller than $$-\frac{\pi}{2},$$

the points of the blade are similarly point-mirrored at the origin and $\tilde{\alpha}_i$ is set to $\tilde{\alpha}_i + \pi$.

4. Accumulation

The steps 1 through 3 are repeated for each blade to be sampled, and the result of the rotation module is accumulated on the final grid.

5. Density Compensation

The sample density is calculated in that a unit blade (one blade whose data points are all set to 1) is rotated together with each blade to be sampled in the method and the result is accumulated. In the event that a scaling ensues (zoom-out or zoom-in), the uniform blade is also correspondingly scaled. Since the result of this scaling is independent of the corresponding blade (blade number), this must be implemented only once and the result must be cached. This is not shown in FIG. 3.

The current density compensation is implemented after all blades have been measured. The elements of the final grid that possess a sample density greater than 1 are thereby multiplied with the inverse of the sample density.

Figure 3:
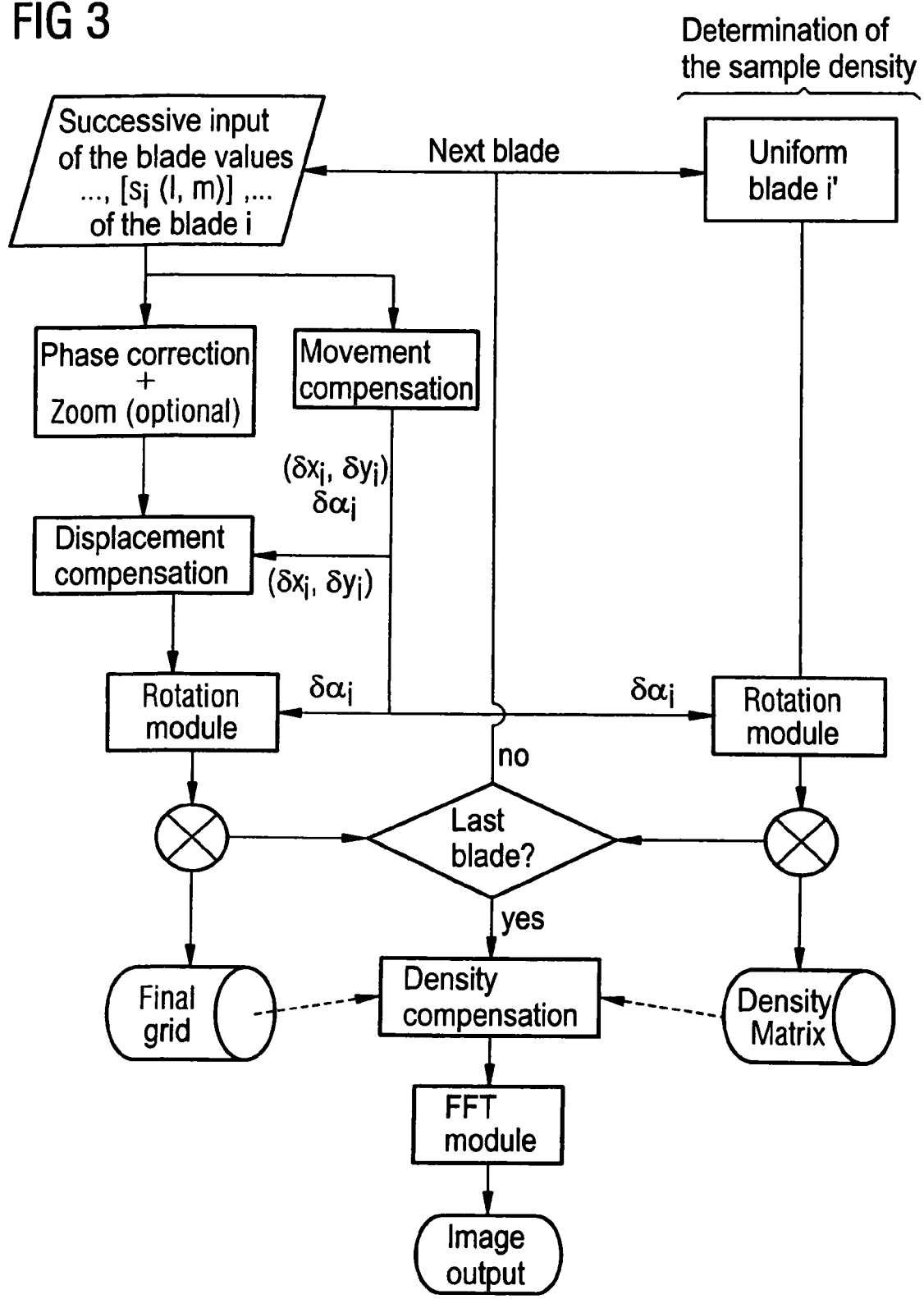
FIG. 3 shows a flowchart of an embodiment the inventive image reconstruction method.

The inventive method is summarized in the following using the workflow diagram shown in FIG. 3.

The input or the importation of the blade values $s_i(l,m)$ of a selected, measured blade i ensues in a first step. In parallel to this, a uniform blade i' congruent to the selected blade i is generated, in which uniform blade i' the imaginary proportions as well as the real proportions of the unoccupied grid points of the complex measurement values are set to zero, and the real parts of the grid points occupied with measurement values are set to one.

Subsequent to this, optional further steps of the phase correction and/or the scaling (zoom) and/or the movement compensation ensue before, in a next step, the rotation module accounts for the rotation of the selected blade i relative to the previously-selected final grid or the equivalent rotation of the corresponding uniform blade i'. Only after this defined, mutual rotation of the blade data sets are the raw blade data accumulated on the final grid until, according to the query "last blade, yes/no," it can be confirmed that the data set of the last blade has been accumulated. Via the parallel, simultaneously-implemented accumulations of the uniform blade values, a density matrix is acquired on the basis of which a density compensation of the actual final grid (completed via accumulation) can be implemented. This density compensation corrects the image blurring which would occur in the central k-space region due to the oversampling. The density compensation ensues via multiplication of each grid point measurement value with a correction factor. Only after the density compensation does a fast Fourier transformation (executed by an FFT module) lead to an isotropically-resolved, artifact-free MRT image.

As already mentioned, the steps of the phase correction, the scaling (zoom) as well as the movement correction are optional, meaning that they do not necessarily have to be executed, whereby the movement correction splits into a displacement compensation ($\delta\tilde{x}_i$, $\delta\tilde{y}_i$) and a rotation compensation $\delta\alpha_i$. The respective rotation compensation is reasonably supported anyway by the rotation module compensating the grid rotation, while the displacement compensation can ensue before or after the rotation module.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography apparatus comprising:
    a magnetic resonance scanner adapted to interact with a subject to obtain a magnetic resonance dataset therefrom;
    a control computer that enters, said dataset in a memory organized as a matrix representing k-space; and
    said control computer being configured to sample said data in k-space in a number of data subsets, which respectively represent blades in a PROPELLER magnetic resonance imaging technique with sampling points of each data subset corresponding to grid points of an a Cartesian initial grid that is used in common for all of said data subsets, and wherein the respective data subsets in the initial Cartesian initial grid can be brought into congruence by rotation, and to select a Cartesian final grid for use in common for all of said data subsets, performing a transformation calculation on the data points of each data subset to transfer the data points of each data subset to a respective new grid that exhibits an orientation of the data subset and grid constants of said final grid if said grid constants of said new grid differ from grid constants of said final grid, performing a transformation calculation on said data points of each data subset, or on data points of each new grid, to said final grid, by applying a rotation module selected from the group consisting of a rotation module based on successive shear and a rotation module based on chirp-z-transformation, to generate acquired data, and transforming said acquired data in the image domain.

2. A method for reconstructing a magnetic resonance tomography image comprising the steps of:

(a) sampling magnetic resonance data in k-space in a number of data subsets respectively representing blades in a PROPELLER magnetic resonance imaging technique, with sampling points of each data subset corresponding to grid points of a Cartesian initial grid that is used in common for all of said data subsets, and wherein the respective data subsets in the Cartesian initial grid can be brought into congruence by rotation;

(b) selecting a Cartesian final grid for use in common for all of said data subsets;

(c) in a computer, performing a transformation calculation on the data points of each data subset to transfer the data points of each data subset to a respective new grid that exhibits an orientation of the data subset and grid constants of said final grid, if said grid constants of said new grid differ from grid constants of said final grid;

(d) selecting a rotation module from the group consisting of a rotation module based on successive shear and a rotation module based on a chirp-z-transformation;

(e) in said computer, performing said transformation calculation on said data points of each data subset, or on data points on each new grid, to said final grid by applying said rotation module, to generate acquired data; and (f) in said computer, transforming said acquired data into the image domain as image domain data, and making the image domain data available at an output of the computer in a form allowing a magnetic resonance image to be generated from the image domain data.

3. A Method as claimed in claim 2 comprising performing the transformation in each of steps (c) and (d) as an interpolation.

4. A method as claimed in claim 2 comprising the additional steps of:

computationally acquiring a running accumulation from step (d);

compensating said acquired data according to a local sample density in k-space; and transforming said acquired data by a fast Fourier transformation.

5. A method as claimed in claim 2 comprising performing steps (b), (c) and (d) in sequence.

6. A method as claimed in claim 2 comprising performing steps (b), (c) and (d) in sequence.

7. A method as claimed in claim 2 comprising combining any two of steps (c), (d) and (e) into a single step.

8. A method as claimed in claim 2 comprising before applying said rotation module, adjusting said datasets by an adjustment selected from the group consisting of a phase correction, a scaling, and a displacement compensation.

9. A method as claimed in claim 2 comprising embodying a rotation movement compensation in said rotation module.

10. A method as claimed in claim 4 comprising determining said local sample density by determining a density matrix by calculating a unit data subset for each data subset.

* * * * *